(12) United States Patent  
Klinger et al.

(10) Patent No.: US 10,098,248 B1
(45) Date of Patent: Oct. 9, 2018

(54) SERVER RACK ANCHORING SYSTEM FOR DATACENTER

(71) Applicant: Amazon Technologies, Inc., Seattle, WA (US)

(72) Inventors: Jeffrey Klinger, Lakewood, WA (US); Kendall Cripe, Seattle, WA (US); Tyler Hanna, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/382,223

(22) Filed: Dec. 16, 2016

(51) Int. Cl.
*H05K 7/18* (2006.01)
*E04B 1/98* (2006.01)
*H05K 7/02* (2006.01)

(52) U.S. Cl.
CPC ............ *H05K 7/023* (2013.01); *H05K 7/186* (2013.01)

(58) Field of Classification Search
None
See application file for complete search history.

(56) References Cited

U.S. PATENT DOCUMENTS

| | | | | |
|---|---|---|---|---|
| 4,180,952 A * | 1/1980 | Vanderlyn | ........... | E04B 1/34347 248/508 |
| 4,272,933 A * | 6/1981 | Lopes | ................. | E04B 1/34347 410/85 |
| 5,156,482 A * | 10/1992 | Owings | .................... | B63H 9/10 403/315 |
| 5,513,483 A * | 5/1996 | Tipton | .................. | B65B 13/186 100/26 |
| 5,687,512 A * | 11/1997 | Spoozak | .................. | E04H 9/14 52/148 |
| 5,699,993 A * | 12/1997 | Hill | ........................ | A47B 91/00 248/316.5 |
| 5,702,087 A * | 12/1997 | Tsukamoto | ............. | F16F 15/00 248/638 |
| 5,791,096 A * | 8/1998 | Chen | ................. | E04F 15/02458 52/126.6 |
| 5,875,601 A * | 3/1999 | Gutelius, Jr. | ........... | E04H 9/021 248/499 |
| 6,024,330 A * | 2/2000 | Mroz | ....................... | F16M 7/00 248/188.4 |
| 6,059,251 A * | 5/2000 | Gutelius, Jr. | .......... | A47B 91/08 248/499 |
| 6,076,326 A * | 6/2000 | Gutelius, Jr. | ............. | E04H 9/02 248/499 |
| 6,094,800 A * | 8/2000 | Gutelius, Jr. | ........... | E04H 9/021 248/638 |
| 6,161,339 A * | 12/2000 | Cornett, Sr. | .............. | E04B 7/02 52/223.13 |

(Continued)

*Primary Examiner* — Xanthia C Cunningham
(74) *Attorney, Agent, or Firm* — Kilpatrick Townsend & Stockton LLP (57) ABSTRACT

A datacenter may include a server rack supported on a floor that is supported over a subfloor. The server rack may be anchored through the floor to the subfloor by a linkage that extends through the floor. The linkage may include a rack anchor secured to the server rack and a subfloor anchor secured to the subfloor. A cable and turnbuckle or other linkage components may be arranged between the rack anchor and subfloor anchor and may be used collectively for removing slack from the linkage and/or otherwise tensioning the linkage to anchor the server through the raised floor and via the linkage to the subfloor.

19 Claims, 8 Drawing Sheets

(56) References Cited

U.S. PATENT DOCUMENTS

| | | | |
|---|---|---|---|
| 6,363,671 B1* | 4/2002 | O'Mara | E04B 5/04 52/223.7 |
| 6,370,835 B1* | 4/2002 | Morgan | B25B 13/06 52/745.05 |
| 6,386,263 B1* | 5/2002 | Tomlinson | E04B 9/001 160/328 |
| 6,425,488 B1* | 7/2002 | Notohardjono | H05K 7/1495 211/182 |
| 6,634,615 B1* | 10/2003 | Bick | H02B 1/54 248/499 |
| 6,817,687 B1* | 11/2004 | Neeld | A47B 91/08 312/351.1 |
| 7,014,399 B1* | 3/2006 | Hsieh | B63B 25/004 410/77 |
| 7,399,148 B2* | 7/2008 | Bruun | B63B 25/24 410/85 |
| 8,065,843 B2* | 11/2011 | Timothy | F16G 11/12 248/208 |
| 8,201,381 B2* | 6/2012 | Heath | E04B 1/4157 52/698 |
| 8,206,071 B1* | 6/2012 | Johnson | B25B 13/065 411/178 |
| 8,365,475 B2* | 2/2013 | Zlatar | E04F 15/02452 248/188.4 |
| 8,453,412 B2* | 6/2013 | Toedte | E04B 1/415 52/166 |
| 8,677,703 B2* | 3/2014 | Meyer | E04F 15/0247 52/126.6 |
| 8,966,832 B1* | 3/2015 | Scott, IV | E04H 9/14 135/118 |
| 9,038,324 B2* | 5/2015 | Kugler | E04F 15/02464 52/126.6 |
| 9,166,390 B2* | 10/2015 | Dean | H02G 3/0456 |
| 9,701,520 B2* | 7/2017 | Pruskauer | B66C 23/205 |
| 2002/0014786 A1* | 2/2002 | Kay | B60P 3/36 296/167 |
| 2003/0037496 A1* | 2/2003 | Cappuccio | E04G 23/0218 52/291 |
| 2004/0216581 A1* | 11/2004 | Liao | G10D 13/006 84/422.1 |
| 2006/0272892 A1* | 12/2006 | Poldmaa | A62B 1/04 182/36 |
| 2007/0107339 A1* | 5/2007 | Matsumoto | E02D 27/32 52/295 |
| 2008/0245004 A1* | 10/2008 | Pryor | E04B 1/26 52/223.4 |
| 2009/0038240 A1* | 2/2009 | Leonard | E04B 1/34347 52/169.9 |
| 2009/0056476 A1* | 3/2009 | Glass | G01L 5/06 73/862.391 |
| 2012/0164929 A1* | 6/2012 | Meyer | H05K 7/20745 454/184 |
| 2012/0240495 A1* | 9/2012 | Eychaner | E04B 9/127 52/220.6 |
| 2012/0291369 A1* | 11/2012 | Knight, III | E04D 11/007 52/126.6 |
| 2013/0104464 A1* | 5/2013 | Meyer | E04F 15/02405 52/126.6 |
| 2013/0299655 A1* | 11/2013 | Sader | F24J 2/5205 248/231.9 |
| 2015/0132044 A1* | 5/2015 | Tylaska | F16G 11/10 403/46 |
| 2015/0360599 A1* | 12/2015 | Bean | B63B 25/28 410/120 |

* cited by examiner

SERVER RACK ANCHORING SYSTEM FOR DATACENTER

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm.

Server farms are commonly used for cluster computing, web services, remote data storage, web hosting, and other web services. Server farms are increasingly being used by enterprises instead of, or in addition to, mainframe computers. As the demand for server farms continues to increase, a need exists to limit the cost of operating a datacenter. Often, a pertinent part of the cost of operating a datacenter relates to the labor costs of installing, removing, or otherwise servicing server racks or other infrastructural elements of a datacenter. Such labor costs may be incurred during initial setup of a datacenter, expanding a capacity of a datacenter, or during routine maintenance to service parts or replace parts that have reached the end of their useful life.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to anchoring systems. The anchoring systems may be utilized to secure server racks in a data center. For example, server racks in a data center may be supported on a raised floor above a subfloor such as a concrete slab or other foundation floor and the anchoring systems may secure the server racks through the raised floor to the subfloor. Securing the server racks through the raised floor to the subfloor may reduce a risk of the server racks undergoing movement (such as in an earthquake or other event) that might otherwise be likely to impair operations of servers and/or other network components associated with the server racks and disrupt availability of computing resources of the data center.

In an example embodiment, the anchoring system may include a linkage that includes a turnbuckle coupled with a length of cable or wire. One end of the linkage can extend through a tile of a raised floor and anchor into a server rack supported on the raised floor. An opposite end of the linkage can be anchored in a channel member secured to a subfloor beneath the raised floor. Flexibility in the linkage (e.g., from the cable) can facilitate an ease of manipulating the linkage to secure the opposite ends of the linkage respectively to the server rack and the channel member. With the ends of the linkage secured, the linkage can be tensioned by rotating the turnbuckle to draw opposite ends of the turnbuckle toward one another. Tensioning the linkage may take up slack out of the linkage and render the linkage effectively a rigid member for holding the server rack in place relative to the subfloor via the channel member. In some situations, a server rack may be anchored by linkages attached at different points or sides of the server rack. Flexibility prior to tightening and/or tensioning the linkages may permit the linkages to readily be extended in any suitable direction to reach the same or different channel members that may be positioned at different orientations and/or positions below the raised floor. Ease of manipulating the linkages to reach any suitable anchor point below the raised floor may facilitate rapid anchoring of server racks that may result in significant cost savings in labor costs.

In various embodiments, the anchoring systems are used in a datacenter that includes internal walls or other structures that form separations between one or more hot and cold zones, or aisles. The cold aisle or aisles are used for providing cool air for the servers and/or network hardware and for access by workers or administrators. The hot aisle or aisles receive heat exhausted from servers and/or networking hardware within the datacenter. This heat is exhausted out of the datacenter by fans and/or natural convention currents that occur in the datacenter.

To aid in air flow, computing devices are arranged so that they draw air from a cold aisle and exhaust air into a hot aisle. For example, servers are mounted in the datacenter so that a front portion, including intake vents for cooling, faces and is exposed to a cold aisle of the datacenter. A rear portion, including an exhaust fan, faces a hot aisle of the datacenter. In this manner, the server is cooled by drawing cold air from the cold aisle and the air that is heated by the server is exhausted into the hot aisle. The servers or racks for the servers can be mounted so that they extend through a structure that separates a cold aisle and a hot aisle.

In a similar manner, networking hardware can be mounted so that air intake is exposed to the cold aisle, with exhaust fans exposed to a hot aisle. Because typical networking hardware includes exhaust on a side and intake on an opposite side, the networking hardware racks are typically turned sideways so that the intake is exposed to the cold aisle for drawing cold air, and the exhaust side is exposed to the hot aisle, permitting hot air from the networking hardware to blow into the hot aisle.

In operation, the cooling fans of the networking hardware draw cool air from a cold aisle and exhaust hot air into a hot aisle. Similarly, the fans for the servers draw air from a cold aisle into a hot aisle. Thus, the standard cooling structures supplied for servers and networking hardware provide air flow from the cold aisles, through the equipment, and into the hot aisles.

The hot air in the hot aisles, via natural convection currents, flows to the top of the datacenter, and can be vented out of the datacenter. Cool air can be provided to the cold aisles by drawing air from outside the datacenter into the cold aisle, and/or from conditioned air being supplied to the cold aisle, for example from chillers. The chillers may correspond, for example, to computer room air handling units located around a periphery of—or remote from—a room with the hot and cold aisles. Fans may be provided to enhance convection flow.

Anchoring systems may utilize structural hardware pieces to anchor a server rack or a network hardware rack. As used herein in the specification and claims, "server rack" is utilized to mean either a server rack or a network hardware rack, to avoid having to repeat both throughout the description. As described above, network racks are typically turned sideways, and may require some spacing between network hardware racks for technician access, whereas servers exhaust out a back exhaust fan, and thus server racks can be installed immediately adjacent to one another. The differentiation in these two structures may warrant some alterations to placement of anchoring system elements relative to a given floor tile, but in general, embodiments herein can utilize the same structure of anchoring system components for a row accommodating a server rack as for a row accommodating a network hardware rack.

Figure 1:
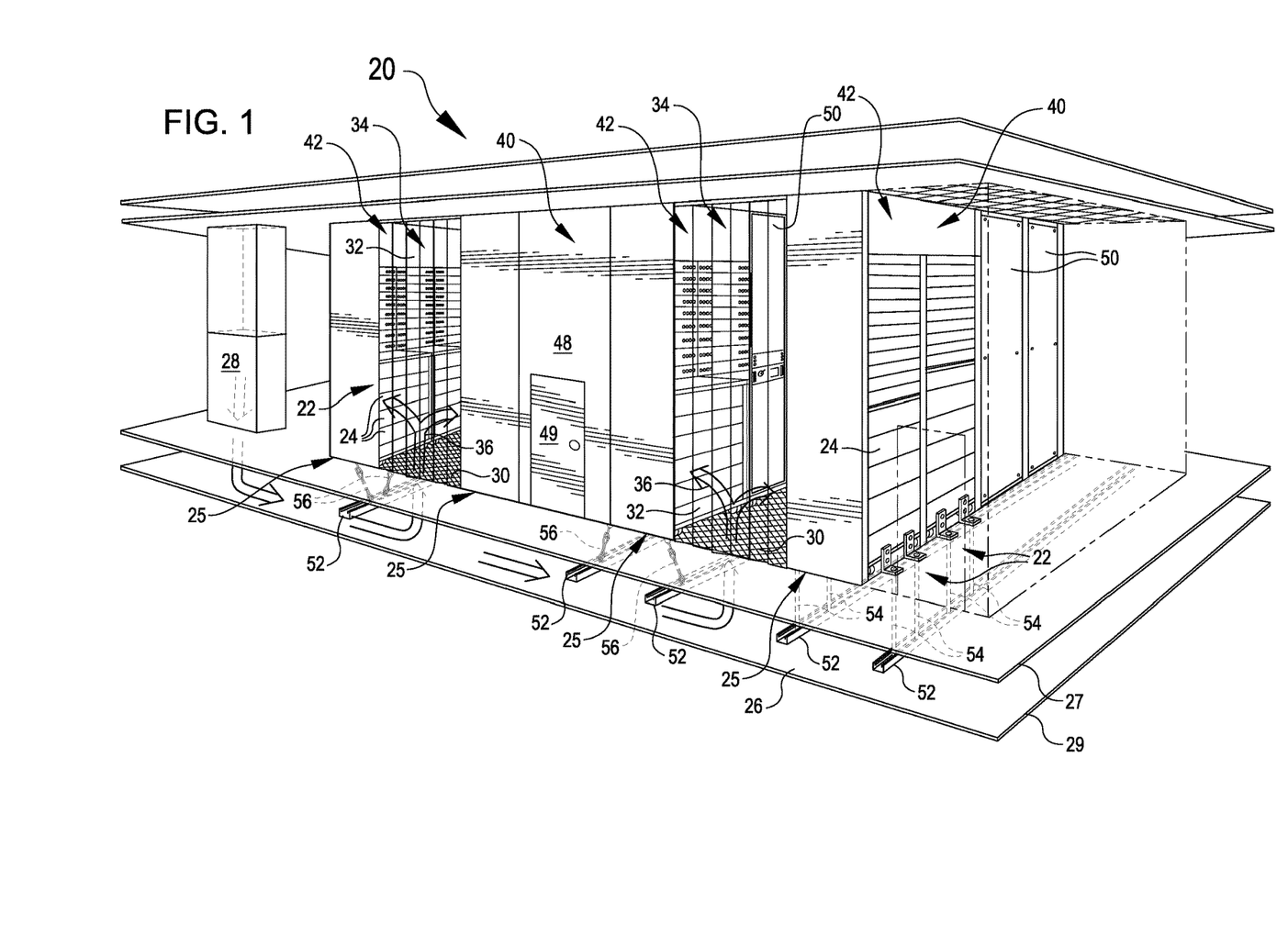
FIG. 1 is a perspective view of a datacenter incorporating anchoring systems in accordance with various embodiments.

Referring now to the drawings, in which like reference numerals represent like elements throughout the several views, FIG. 1 shows a datacenter 20 in accordance with embodiments. The datacenter 20 includes several server racks 22 having servers 24 mounted therein. Although the servers 24 are diagrammatically shown as rectangles in the drawings, the servers may fill only portions of the rack, as is known. As described above, the server racks 22 may alternatively include network hardware equipment, not shown.

The datacenter 20 includes a cooling flow defining hot and cold aisles, as described above. In various embodiments shown in the drawings, a cold air plenum 26 is attached to a cold air supply 28, which may be, for example, chillers, air conditioning, outside air venting, computer room air handling units, and/or other cool air supply. The cold air supply 28 is located at a periphery of a room of the datacenter 20, as is typical to allow as much space as possible in a climate-controlled space to be used for servers 24.

Air from the cold air plenum 26 flows through vents 30 in the floor 27 of the datacenter 20. The air that flows through the vent 30 flows into a cold aisle 34 for the datacenter. In various embodiments, chilled air in the cold aisle 34 can be contained by a cold air containment system, which may be, for example, air curtains 32. The cold air containment system (e.g., the curtains 32) prevents flow of the chilled air out of the cold aisle 34. As shown by the arrows 36, cold air from the cold air plenum 26 flows out of the vents 30 and into the server racks 22. This flow may be provided, for example, by the fans that are provided on the servers 24 or other network hardware equipment, as described above.

Hot aisles 40 are also provided in the datacenter 20. In FIG. 1, the hot aisles 40 are enclosed structures, and part of the wall for the far right hot aisle in FIG. 1 is depicted as transparent to show detail. As described above, these hot aisles 40 are isolated from the cold aisles 34 by the server racks 22 and the cold air containment system, in the example shown, the air curtains 32. In addition, in accordance with embodiments, a hot aisle containment structure 42 is provided for containing the hot air in the hot aisle and directing that air to a hot air plenum 44 in or above the ceiling 45 of the datacenter 20.

The hot aisle containment structure 42 includes structures that are assembled to seal the area around the back end of the server racks 22 in the datacenter 20. The hot aisle containment structure 42 prevents the flow of hot air exhausting from the servers 24 back toward the cold aisle 34 or other parts of the datacenter 20. Although the hot aisle containment structure 42 is shown in FIG. 1 as solid panels, in some embodiments, it may additional or alternatively include flexible structures such as curtains similar to the air curtains 32. In various embodiments, the hot aisle is enclosed by additional structures, such as walls 48 at the ends of the hot aisle. As shown in FIG. 1, such walls can enclose one side of a hot aisle 40 at the end of the datacenter 20. Doors 49 can be provided for access into the hot aisle 40.

Rows 25 are also defined in the datacenter 20. The rows 25 correspond to the space occupied by the server racks 22 when installed and/or the space designated for receiving the server racks 22 for installation. The rows 25 shown in FIG. 1 provide at least part of the separation between the hot aisles 40 and the cold aisles 34 of the datacenter 20.

Figure 2:
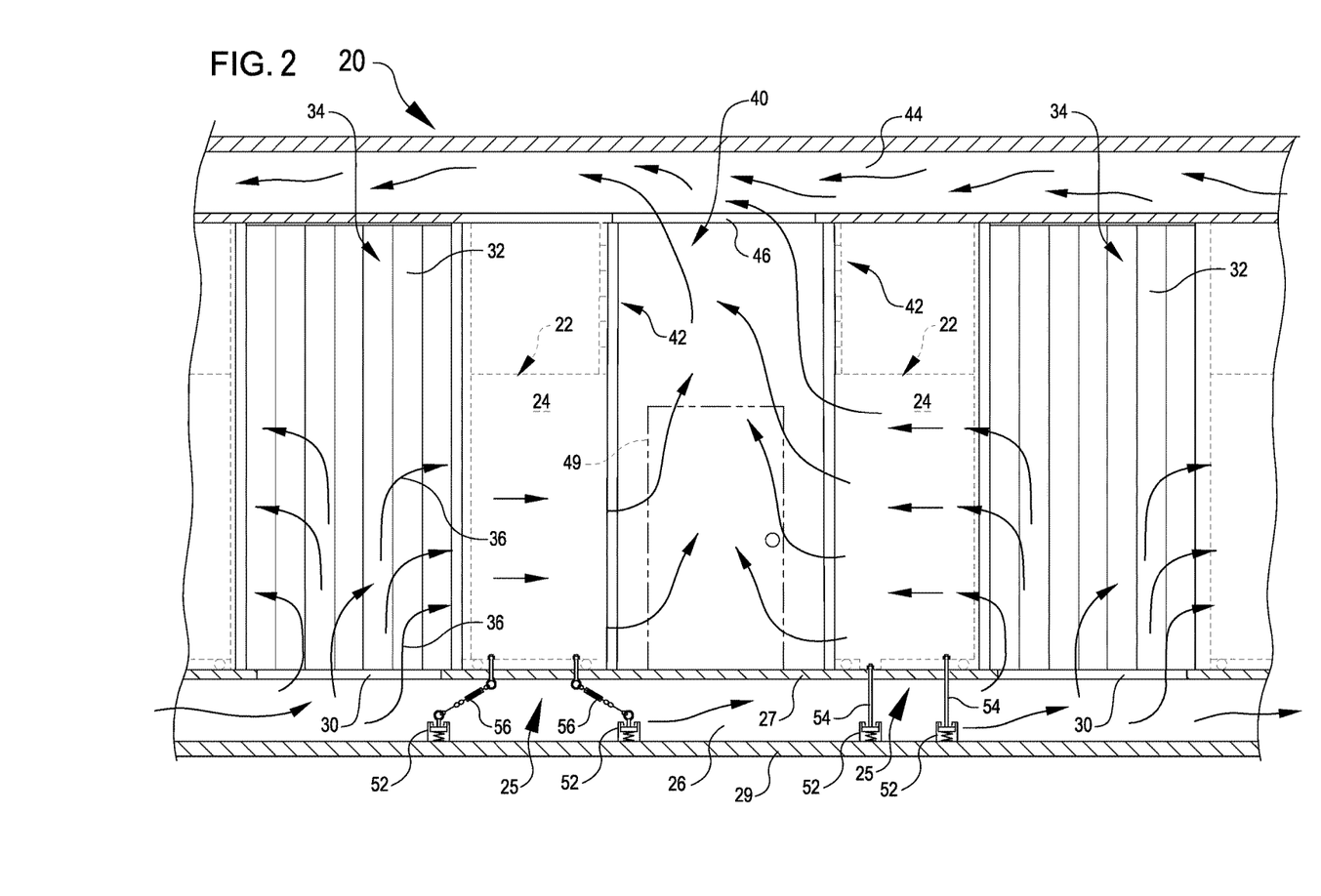
FIG. 2 is a diagrammatic representation of air flow through the datacenter of FIG. 1.

FIG. 2 is a diagrammatic representation of air flow in the datacenter 20 in accordance with embodiments. As can be seen, air flows from the cold air plenum 26, up through the grates 30 and into the cold aisles 34. The chilled air is drawn through the servers 24 in the server racks 22 (e.g., through servers positioned into or out of the page in the row 25) and is exhausted by the servers into the hot aisle 40. The air is heated as it cools the servers 24, and thus is warm or hot when it enters the hot aisle 40. The heated air then exits the hot aisle 40 and flows through vents 46 into the hot air plenum 44. The hot aisle containment structure 42 and the air curtains 32 (or other cold air containment systems) prevent or limit the flow of air along other flow paths than those just described.

The cold air plenum 26 depicted in FIGS. 1 and 2 is defined between a subfloor 29 and the floor 27. The floor 27 is positioned raised above the subfloor 29, for example, to provide space for the cold air plenum 26 and/or for routing of other components such as data cables, power cables, electrical wiring, plumbing, etc. (not shown). The subfloor 29 may correspond to a concrete slab, for example, as may be included on a ground level of a building (e.g., as part of the building foundation) or on a floor on other than ground level (e.g., as part of an infrastructure of an upper story or basement story of the building). The subfloor 29 may additionally or alternatively include any combination of girders, beams, or other structural elements arranged to provide a suitable base floor for anchoring to for seismic purposes.

Struts or channel members 52 are shown fixed to the subfloor 29 in FIGS. 1 and 2 for facilitating anchoring of the server racks 22 relative to the subfloor 29. The racks 22 are shown anchored to the channel members 52 according to different techniques. In particular, the areas of the datacenter 20 illustrated in FIGS. 1 and 2 are shown in the midst of a retrofitting process, such that some racks 22 are still shown anchored utilizing threaded rods 54 (e.g., as described in greater detail in FIG. 3), while other racks 22 are shown anchored utilizing linkage 56 (e.g., as described in greater detail beginning in FIG. 4).

Figure 3:
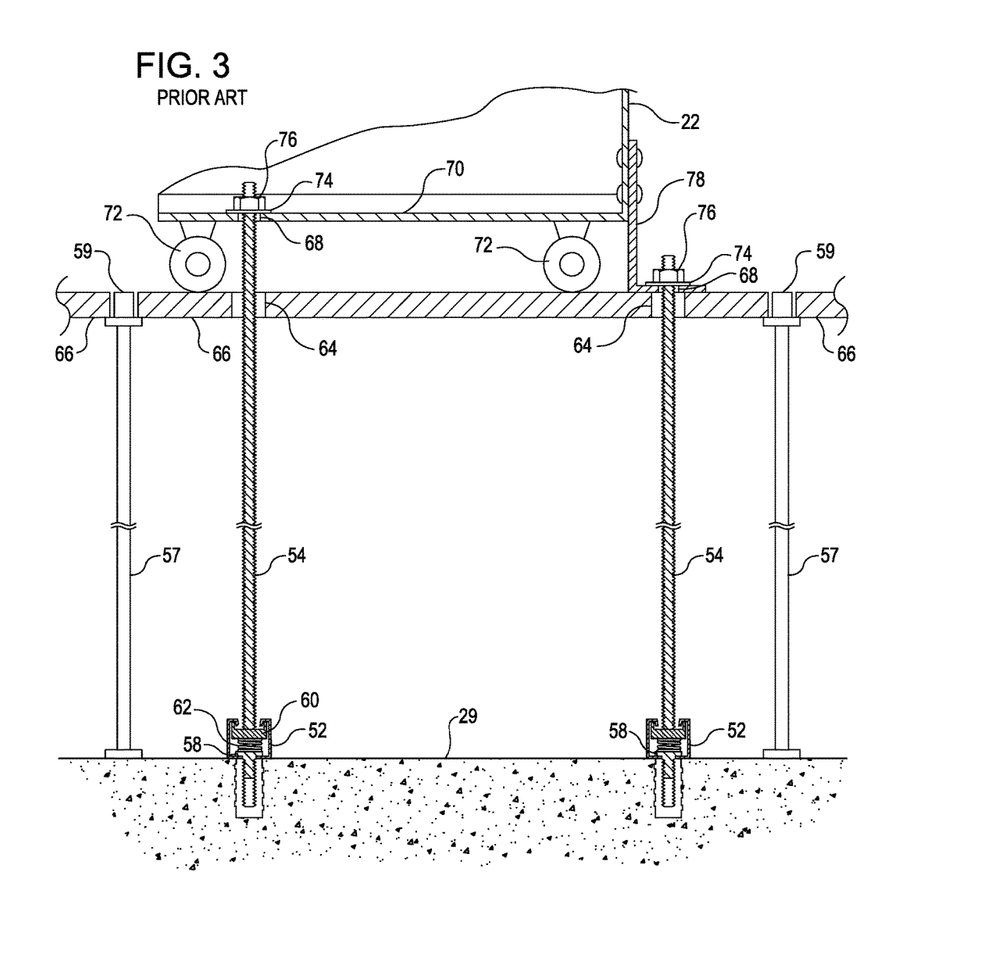
FIG. 3 is side view of an example of a server rack secured by conventional anchoring techniques.

FIG. 3 illustrates a server rack 22 anchored to the subfloor 29 via a threaded rod 54 according to conventional techniques known in the art. The server rack 22 is shown supported on a tile 66 that forms a portion of the floor 27 above the subfloor 29. The tile 66 is shown supported by a grid that includes pedestals 57 and stringers 59 supported by the pedestals 57. Generally, the pedestals 57 are supported at a bottom end by the subfloor 29 and support stringers 59 at a top end. The stringers 59 extend between individual pedestals 57 to provide structural outlines on which and/or along which the tiles 66 rest. The stringers 59 and tiles 66 are shown having similar thicknesses so that the tops of each are relatively coplanar to form a smooth floor surface. In other arrangements, the tiles 66 may at least partially extend over the top of the stringers 59 so that edges of the tiles 66 abut one another to form a smooth floor surface.

In FIG. 3, channel members 52 are fixed to the subfloor 29 by anchor bolts 58. A channel nut 60 is shown within each respective channel member 52 and biased by a spring 62 into an engaged arrangement in which flanges on the channel nut 60 engage in-turned lips on the channel member 52. Above each channel member 52, a through hole 64 is drilled through a tile 66 that forms a portion of the floor 27. The through hole 64 in the tile 66 is positioned for alignment with features of the server rack 22.

For example, with reference to the arrangement shown at left in FIG. 3, the through hole 64 is arranged for positioning beneath a corresponding hole 68 in a base 70 of the server rack 22 that is supported above the tile 66 by wheels 72. A threaded rod 54 is positioned extending through the through hole 64 so that a bottom end of the threaded rod 54 is received in the channel nut 60 engaged in the channel member 52 and so that a top end of the threaded rod 54 extends through the hole 68 in the base 70 of the server rack 22. The end of the threaded rod 54 extending through the hole 68 in the base 70 of the server rack 22 is shown secured to the base 70 of the server rack 22 by a washer 74 and a nut 76. The threaded rod 54 is thus secured to both the channel member 52 and the base 70 of the server rack 22 to anchor the server rack 22 to the subfloor 29.

The arrangement shown at right in FIG. 3 is similar, but differs in that the through hole 64 in the tile 66 of the floor 27 is arranged for alignment with a bracket 78 that extends from an edge of the server rack 22. As with the arrangement shown at left, in the arrangement at right, the threaded rod 54 is shown positioned extending through the through hole 64 in the tile 66 of the floor 27, with the top end of the threaded rod 54 secured with a washer 74 and a nut 76 to the bracket 78 of the server rack 22, while the bottom end is secured in the channel nut 60 engaged in the channel member 52 so that the server rack 22 as a result is anchored to the subfloor 29.

Although securing server racks 22 with threaded rods 54 may provide adequate stability for the server racks 22 during seismic activities, several issues may arise when implementing such techniques. For example, the rigid nature of the threaded rods 54 generally requires that a through-hole 64 in the tile 66 of the floor 27 be situated directly over the channel member 52. To accomplish such precise vertical alignment, a technician be faced with spending a significant amount of time taking measurements before knowing where an appropriate location is in the tile 66 for drilling a through-hole 64. For example, the technician may need to access the space beneath the floor 27 to obtain measurements from the channel member 52 to pedestals 57 or other reference point on the subfloor 29 that can be translated to distances from the stringers 59 or other reference points on the floor 27 from which additional measurements can be made to identify a location on the tile 66 that is directly above the channel member 52.

Additionally, the rigid threaded rods 54 may be cumbersome to install, resulting in extensive labor costs. Although in the arrangement at right in FIG. 3 the threaded rod 54 may be inserted vertically from above (e.g., inserted first through the bracket 78, then through the through hole 64 in the tile 66, and finally into the channel nut 60 in the channel member 52), such installation from above may not always be feasible. For example, with reference to the arrangement left in FIG. 3, the server rack 22 may include servers or other components above the base 70 that block access to the base 70 from above. In situations in which installation from above is not feasible, installation of the threaded rod 54 from below the through hole 64 in the tile 66 may involve a significant amount of crawling around underneath the floor 27 and wrestling the lengthy threaded rod 54 to navigate it into position around any pedestals 57, cabling, plumbing conduits, or other structures that may be present beneath the floor 27.

Furthermore, because the threaded rod 54 is of a length to reach from the channel member 52 to the server rack 22, the threaded rod 54 is generally too long to fit upright entirely beneath the floor. Accordingly, during installation, the threaded rod 54 typically is angled through the through-hole 64 in the tile 66 before being vertically aligned with the channel nut 60 in the channel member 52 and with the hole 68 in the base 70 of the server. To accommodate such angling, the through-hole 64 in the tile 66 often is of a substantially larger diameter than a diameter of the threaded rod 54. Since the presence of any hole through the tile 66 will reduce a load-bearing capacity of the tile 66 by an amount corresponding to the size of the hole, utilizing holes that are substantially larger than the threaded rod 54 may undesirably weaken the strength of the tile 66. For example, the tile 66 may be constructed with a certain size (e.g., volume, footprint, cross-sectional area, length, width, height, etc.), material, or combination of these and/or other characteristics such that the tile has sufficient strength and/or other qualities (e.g., footprint in which a footprint the server rack 22 can fit) to be able to support a fully loaded server rack 22 when the server rack 22 has been placed on the tile 66, and adding too many through-holes and/or through-holes that are too large may reduce a strength and/or other quality of the tile 66 below a threshold at which the server rack 22 can be adequately supported by the tile 66. Moreover, in situations that call for introduction of additional through-holes 64 through the tile 66 (e.g., in situations where a different server rack 22 with a different arrangement of anchoring interfaces is to replace a previously anchored server rack 22, or in situations in which an initial through-hole 64 was placed in an incorrect location such as due to errors in measurements), the additional through-holes 64 may weaken the tile 66 to a level where a new tile 66 must be utilized at additional cost to meet standards for adequate strength for supporting a server rack 22.

In addition, installers may be prone to over-tighten when securing server racks 22 with threaded rods 54 and impart unintended forces. For example, an installer using a wrench on a nut 76 adjacent the base 70 of the server rack 22 may continue wrenching as long as the nut 76 is readily traveling down the threaded rod 54. However, this may pull the base 70 of the server rack 22 down toward the subfloor 29 and bend or otherwise damage the server rack 22 in the process. Additionally or alternatively, over-tightening may pre-stress the threaded rods 54 and increase a risk of the threaded rods 54 failing prematurely in a seismic event.

Figure 4:
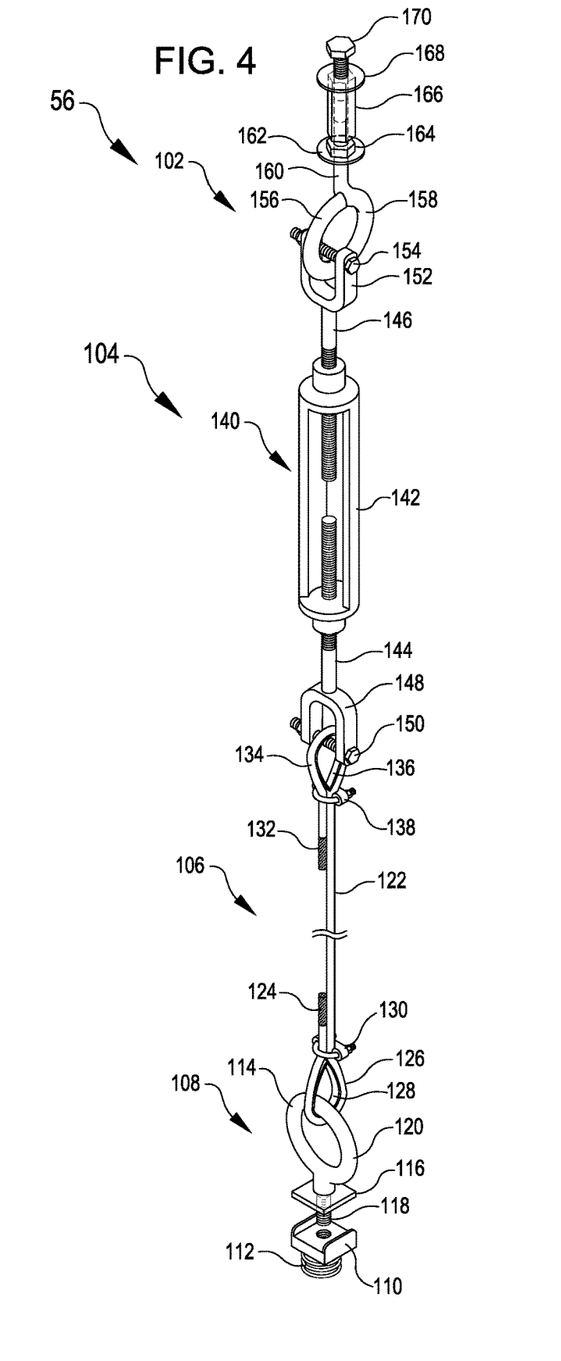
FIG. 4 is a perspective view illustrating elements of an example of an anchoring system in accordance with various embodiments.

FIG. 4 illustrates an example of a linkage 56 that may be utilized (e.g., in lieu of the threaded rod 54 discussed with reference to FIG. 3) to anchor a server rack 22 to a subfloor 29 according to certain embodiments of the present disclosure. In FIG. 4, the linkage 56 is shown with a first anchor portion 102, a first linkage portion 104, a second linkage portion 106, and a second anchor portion 108. Generally, the first anchor portion 102 may connect with a server rack 22, the second anchor portion 108 may connect with the subfloor 29, and the first linkage portion 104 and the second linkage portion 106 may connect with one another and respectively to the first anchor portion 102 and the second anchor portion 108 to cause the server rack 22 to be connected to the subfloor 29 for anchoring purposes.

With reference to the bottom portion of FIG. 4, the second anchor portion 108 is depicted as including a channel nut 110, a spring 112, an eye-bolt 114, and a plate 116. A threaded shaft 118 extending from an eyelet 120 of the eyebolt 114 is shown extending through the plate 116 and the channel nut 110.

Proceeding upward from the bottom portion of FIG. 4, the second linkage portion 106 is depicted as including a cable 122. A lower end 124 of the cable 122 is shown folded in a lower loop 126 about a lower collar 128 and secured by a lower cable clamp 130. The lower cable clamp 130 may releasably secure a portion of the cable 122 in the loop 126 such that a length of the linkage 56 between the first anchor portion 102 and the second anchor portion 108 is adjustable by adjusting a position of the cable 122 relative to the lower cable clamp 130. The lower loop 126 of the lower end 124 of the cable 122 is shown arranged through the eyelet 120 of the eyebolt 114 so that the lower end 124 of the cable 122 and the eyebolt 114 are coupled together. At an upper end 132 of the cable 122, the cable 122 is shown folded in an upper loop 134 about an upper collar 136 and secured by an upper cable clamp 138.

Proceeding further upward from the bottom portion of FIG. 4, the first linkage portion 104 is depicted as including a turnbuckle 140. The depicted turnbuckle 140 includes a frame 142, a lower arm 144, and an upper arm 146. The lower arm 144 and the upper arm 146 are received in opposite ends of the frame 142 and oppositely threaded such that rotating the frame 142 in a first direction will draw the lower arm 144 and the upper arm 146 toward one another into the frame 142 and such that rotating the frame 142 in a second, opposite direction will move the lower arm 144 and the upper arm 146 away from one another outward from the frame 142. The lower arm 144 is shown terminating in a lower fork 148 coupled with the upper loop 134 of the cable 122 by a bolt 150 arranged passing through the upper loop 134 and through each prong of the lower fork 148. The upper arm 146 is shown terminating in an upper fork 152 closed off by a bolt 154 arranged passing through each prong of the upper fork 152.

With reference to the top portion of FIG. 4, the first anchor portion 102 is depicted as including an upper eyebolt 156. The upper eyebolt 156 includes an eyelet 158 and a threaded shaft 160. The eyelet 158 of the upper eyebolt 156 is shown coupled with the upper fork 152 of the upper arm 146 of the turnbuckle 140 by the bolt 154 extending through the eyelet 158 and the prongs of the upper fork 152.

The first anchor portion 102 is also depicted as including a seating washer 162, a seating nut 164, a coupling nut 166, a top washer 168, and a top bolt 170. The coupling nut 166 may have a height that facilitates simultaneously receiving portions of the top bolt 170 and the upper eyebolt 156 for coupling the top bolt 170 and the upper eyebolt 156 together. As depicted, the threaded shaft 160 of the upper eyebolt 156 is received through the seating washer 162, through the seating nut 164, and into a lower portion of the coupling nut 166. An upper portion of the coupling nut 166 is shown receiving the top bolt 170, and the top washer 168 is shown situated about the top bolt 170 between the coupling nut 166 and a head of the top bolt 170.

Figure 5:
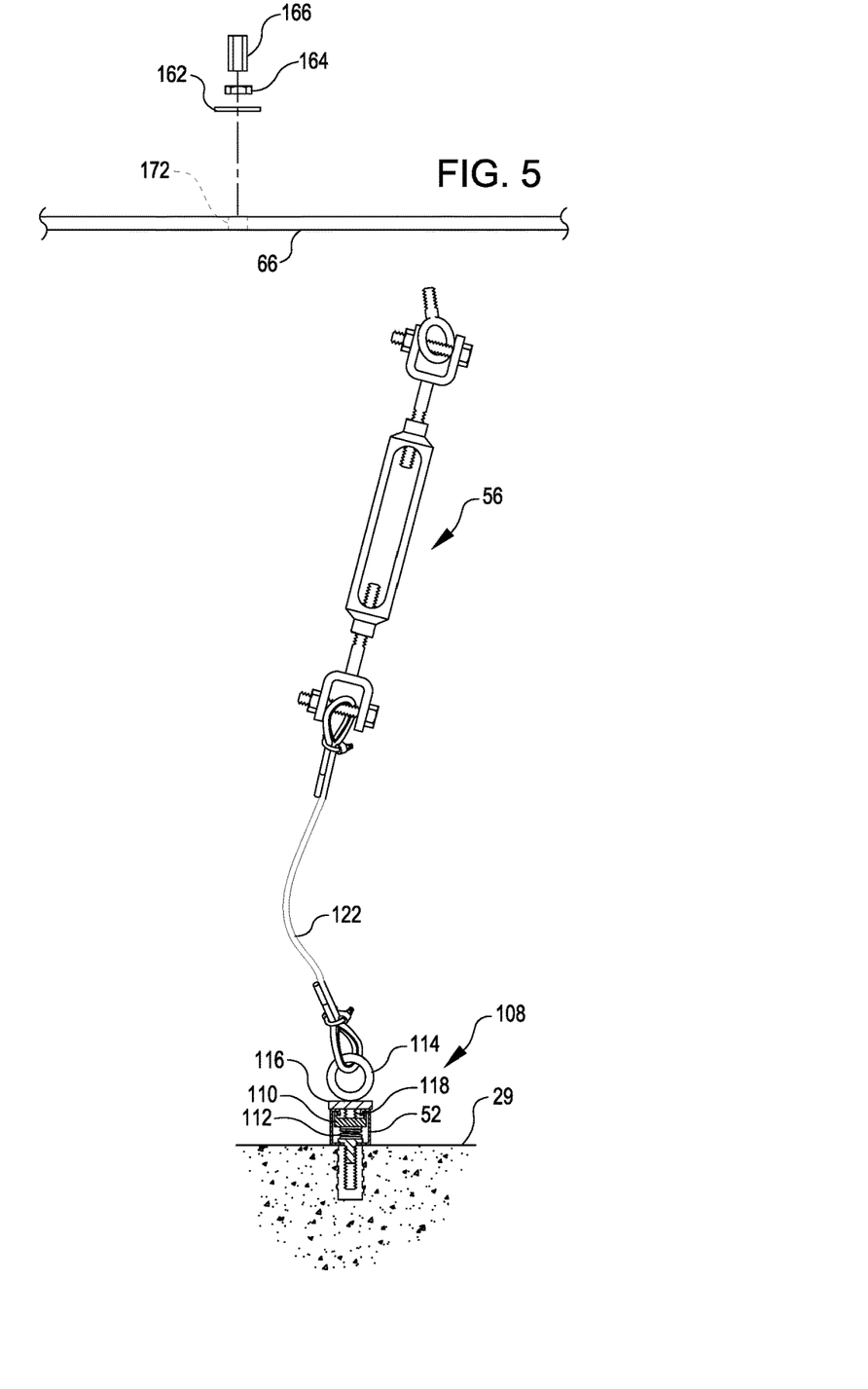
FIGS. 5-7 are views illustrating stages in an example of an installation process of the anchoring system of FIG. 4 in accordance with various embodiments.
Figure 6:
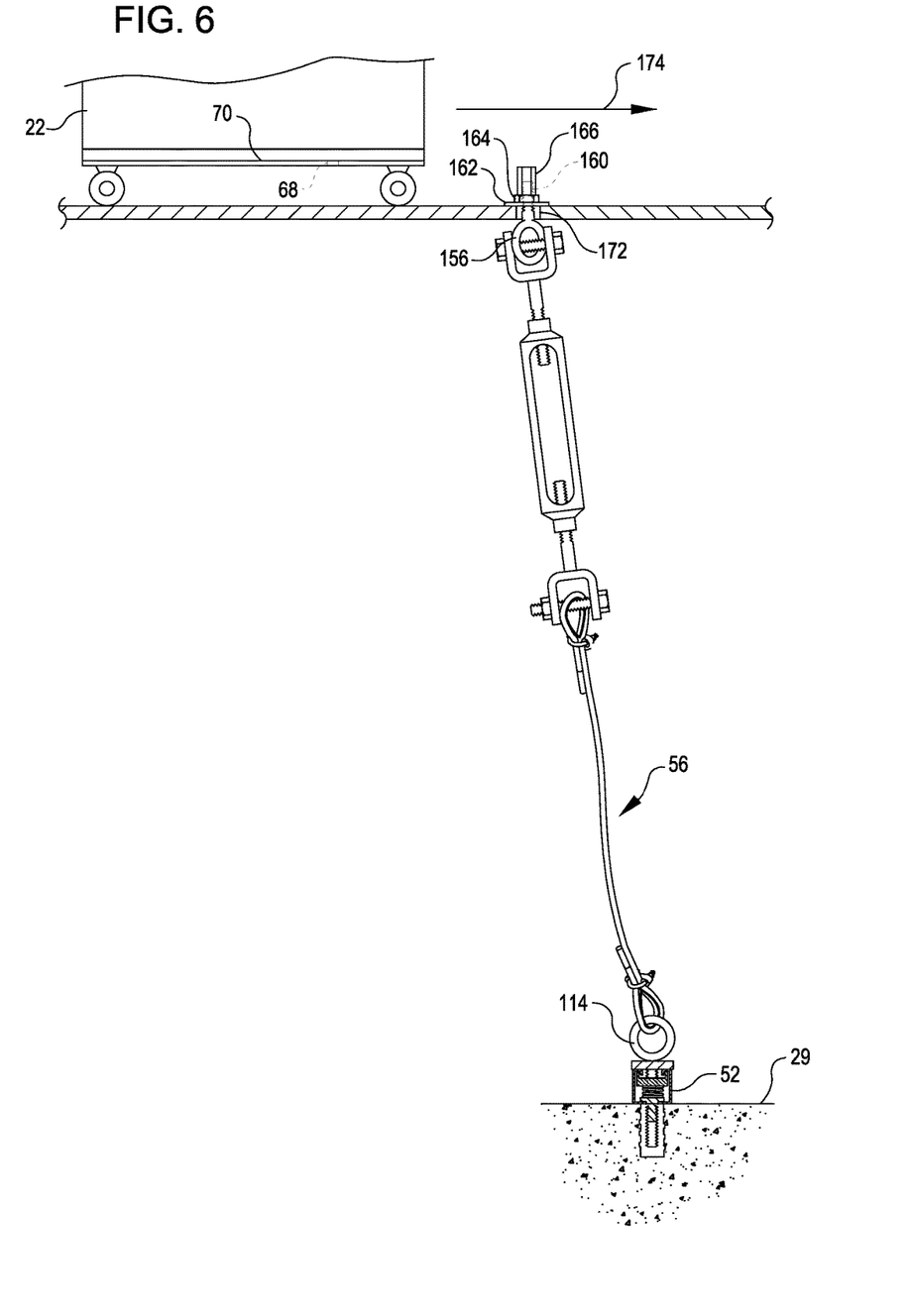
Figures 7, 7A:
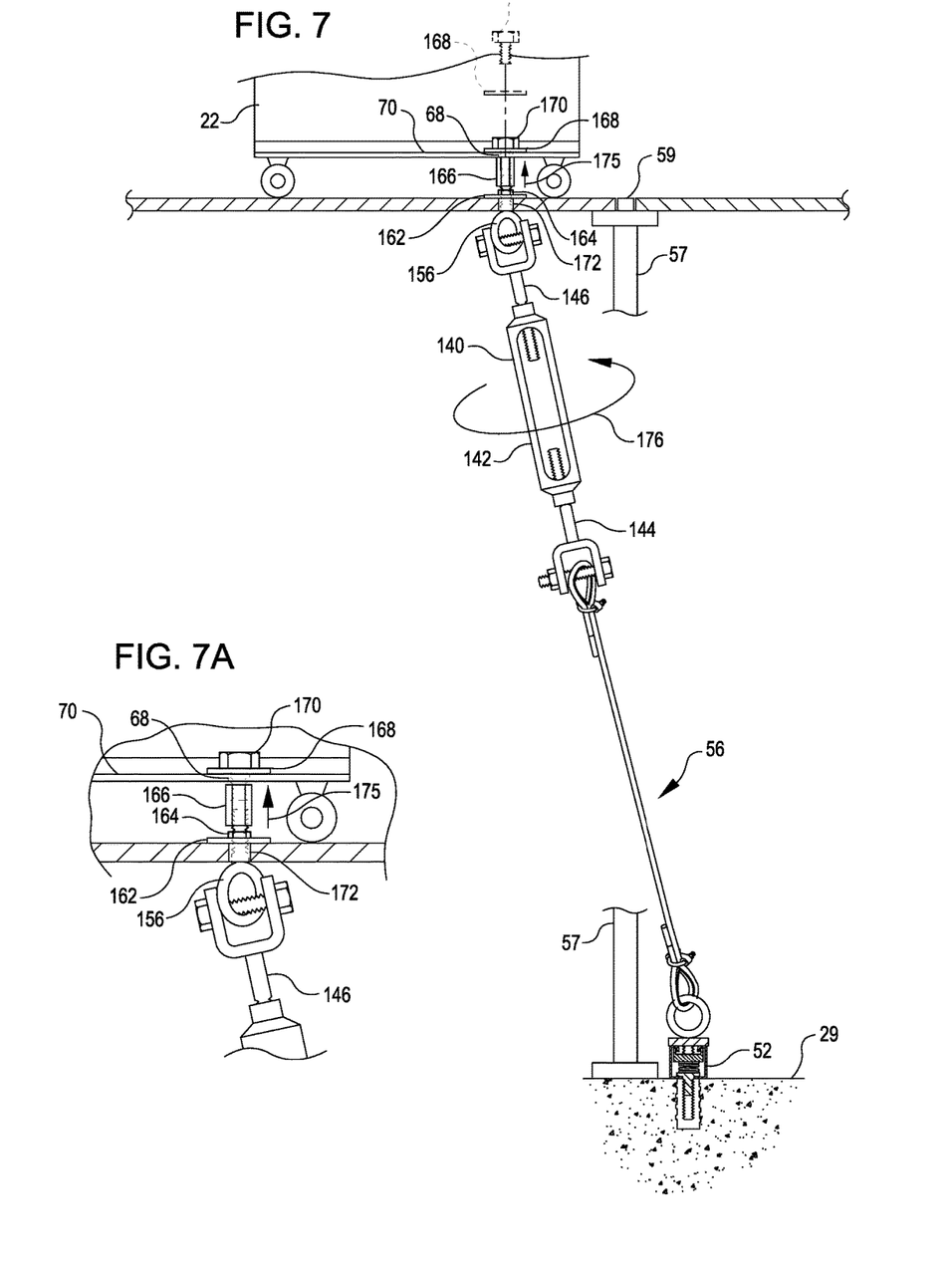
FIG. 7A is a detail view of a portion of FIG. 7 in accordance with various embodiments.

FIGS. 5-7 illustrate stages in an example of a process of installing the linkage 56 of FIG. 4 to anchor a server rack 22 to a subfloor 29. In FIG. 5, the second anchor portion 108 is shown installed or anchored relative to a channel member 52 (e.g., which may be the same channel member 52 as shown in FIG. 3 or a different one). The channel nut 110 is shown engaged in the channel member 52, with flanges from the channel nut 110 engaging in-turned lips of the channel member 52. The spring 112 is shown biasing the channel nut 110 into this engagement. The plate 116 has been situated over a top of the channel member 52, and the eyebolt 114 has been manipulated (e.g., rotated so that the threaded shaft 118 engages the channel nut 110) to draw the plate 116 and the channel nut 110 toward each other in a sandwiching or clamping relationship about the top of the channel member 52. The lower end of the linkage 56 is thus shown secured to the subfloor 29 via the channel member 52, while the remainder of the linkage 56 (e.g., including the cable 122) is sufficiently flexible to facilitate alignment with a through hole 172 in a floor tile 66, even if the through hole 172 is not substantially directly vertically aligned over the channel member 52. In some embodiments, the second anchor portion 108 can be directly anchored to the subfloor 29, for example, in the absence of a channel member 52. As a non-limiting example, the eyebolt 114 may be received in and/or secured to the subfloor 29 in place of the bolt shown anchoring the channel member 52 to the subfloor 29. The eyebolt 114 may be secured to the subfloor 29 by any suitable technique, including, but not limited to, engagement between the threaded shaft 118 of the eyebolt 114 and mating features in the subfloor 29 if present, securement by adhesives that may secure the eyebolt 114 regardless of whether the eyebolt 114 includes the threaded shaft portion 118, or securement by locating the eyebolt 114 in the subfloor 29 in conjunction with concrete pouring or other processes of constructing and/or modifying the subfloor 29.

Referring to FIG. 6, the upper eyebolt 156 is shown extended through the through hole 172 in the floor tile 66. The seating washer 162 and the seating nut 164 are shown secured about the threaded shaft 160 of the upper eyebolt 156, which may seat or secure the upper eyebolt 156 to the floor tile 66. The coupling nut 166 is also shown received on the threaded shaft 160 of the upper eyebolt 156. For example, the coupling nut 166 may be rotated onto the threaded shaft 160 of the upper eyebolt 156 until a top of the coupling nut 166 is below a level of a bottom of the base 70 of the server rack 22. Such a relative position of the coupling nut 166 to the base 70 of the server rack 22 may permit the server rack 22 to be moved over the top of the through hole 172 without striking the coupling nut 166, for example, as illustrated by arrow 174.

Referring to FIGS. 7 and 7A, the top bolt 170 is shown inserted through the top washer 168, inserted through a hole 68 in the base 70 of the server rack 22, and received in the coupling nut 166. From the position of the coupling nut 166 described with reference to FIG. 6 for allowing the server rack 22 to be positioned overhead, the coupling nut 166 may be rotated or otherwise moved upward (e.g., as illustrated at arrow 175) onto the top bolt 170 to bring the top bolt 170 and the coupling nut 166 into a sandwiching or clamping relationship about the base 70 of the server rack 22. This may secure the upper eyebolt 156 to the base 70 of the server rack 22 without imparting the type of downward pulling force described above that might bend or damage the base 70 of the server rack 22 when using threaded rods 54 for anchoring. Generally, in the state of the linkage 56 shown in FIG. 6, the lower eyebolt 114 is secured to subfloor 29 via the channel member 52, the upper eyebolt 156 is secured to the floor tile 66 via at least the seating nut 164, and the server rack 22 is secured to the upper eyebolt 156 at least via the top bolt 170 and the coupling nut 166.

In FIG. 7, the linkage 56 is shown tensioned relative to the state shown in FIG. 6. In particular, the turnbuckle 140 is shown having been rotated (e.g., as illustrated by arrow 176) to cause the first arm 144 and the second arm 146 to be pulled inward towards one another within the frame 142 of the turnbuckle 140 relative to the position shown in FIG. 6. Such tensioning can remove slack from the linkage 56 and cause the linkage 56 to act like a rigid member for carrying tension forces for anchoring the server rack 22 relative to the subfloor 29. In some embodiments, the turnbuckle 140 may be rotated by hand to reach a tightened state, although the turnbuckle 140 may additionally or alternatively be rotated by an implement, such as by inserting a bar through the frame 142 or a fitting a wrench about the frame 142 for leverage.

In some embodiments, use of linkages 56 may permit a server rack 22 to be anchored to the subfloor 29 at a position that is laterally offset from a position directly below a floor tile 66 on which the server rack 22 is supported. For example, the through hole 172 for the upper eyebolt 156 is shown to the left in FIG. 7 of a pedestal 57 and a stringer 59 that divide the floor tile 66 on which the server rack 22 is supported from an adjacent floor tile 66, and the channel member 52 by which the server rack 22 is ultimately anchored to the subfloor 29 is shown to the right in FIG. 7 of the pedestal 57. As another example, referring to FIG. 2, the server rack 22 positioned within the row 25 to the left of the door is shown anchored by linkages 56 to channel members 52 that are respectively located beneath a cold aisle 34 and a hot aisle 40. In some embodiments, anchoring a server rack 22 by a linkage 56 that extends at least partially beneath an aisle may increase an ease of access to the linkage 56 through the floor 27, such as for inspection, installation, or other situations.

Server racks 22 may be anchored to a subfloor 29 via multiple linkages 56. For example, in some embodiments, a server rack 22 may have a rectangular footprint and a set of four linkages 56 may be coupled with the rack 22 respectively adjacent each corner of the rectangular footprint. However, any suitable number of linkages 56 may be utilized for anchoring, including one, two, three, four, or more than four. In some embodiments, a single channel member 52 may receive multiple linkages 56 coupled with a server rack 22, such as linkages 56 coupled with opposite sides of the server rack 22. For example, referring to FIG. 1 and the channel member 52 depicted to the left of the door 49, the channel member 52 is shown receiving a linkage 56 that is coupled to a front of the server rack 22 as well as a linkage that is coupled to a rear of the server rack 22. In some embodiments, distinct linkages 56 may be received in distinct channel members 52 (e.g., as shown, for example, referring to FIG. 1 with reference to the channel members 52 shown immediately to the right of the door 49). In some embodiments, replacement server racks 22 may be anchored via linkages 56 to channel members 52 that were utilized for anchoring prior server racks 22 with threaded rod 54, even if holes 68 in the base 70 or other anchoring features in the replacement server racks 22 do not line up directly vertically over the channel members 52 when the replacement server racks 22 are put in place.

Although FIGS. 5-7 were described above with respect to a particular sequence of installation, linkages 56 are not limited to the order described above. For example, the linkage 56 may be coupled to the floor tile 66 before, after, or during coupling of the linkage 56 to the channel member 52 or the subfloor 29. In some embodiments, an arrangement of through holes 172 corresponding to holes 68 in the base 70 or other anchoring features of particular server rack 22 may be introduced into a floor tile 66 and then receive respective the upper eyebolts 156 or other components of a linkage 56, for example, to facilitate an ease of installation in a datacenter upon receipt from a remote location of an assembly including the floor tile 66 with the linkage 56 pre-installed in the floor tile 66. As another example, the linkage 56 may be coupled to the server rack 22 before, after, or during coupling of the linkage to the channel member 52. In some embodiments, the linkage 56 may be coupled to the server rack 22 without also coupling the linkage to a floor tile 66. In some embodiments, the linkage 56 may be packaged with the server rack 22 (e.g., temporarily secured through a hole 68 in the base 70) to facilitate ready access to components for anchoring upon arrival to (or implementation in) the datacenter 20.

Figure 8:
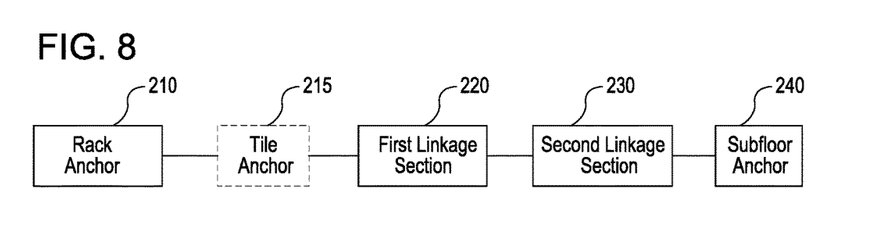
FIG. 8 is a diagrammatic representation of elements that may be incorporated into anchoring systems in accordance with various embodiments.

Other elements may additionally or alternatively be utilized in the linkage 56. For example, FIG. 8 is a diagrammatic representation of elements that may be included to supplement or substitute elements described elsewhere herein. FIG. 8 shows a linkage 200 having a rack anchor 210, a first linkage section 220, a second linkage section 230, and a subfloor anchor 240. In some embodiments, the linkage 200 also includes a tile anchor 215, shown in broken lines. The linkage 200 may correspond to the linkage 56 shown in FIG. 4. For example, the rack anchor 210 may correspond to at least the combination of the top bolt 170 and the coupling nut 166, the tile anchor 215 may correspond to at least the combination of the upper eyebolt 156 and seating nut 164, the first linkage section 220 may correspond to at least the turnbuckle 140, the second linkage section 230 may correspond to at least the cable 122, and the subfloor anchor 240 may correspond to at least the combination of the lower eyebolt 114 with the channel nut 110.

The rack anchor 210 may include appropriate structure for coupling with a server rack 22 and with the remainder of the linkage 200, such as with the tile anchor 215 and/or with the first linkage section 220. For example, the rack anchor 210 may include any suitable rivet, bolt, nut, clamp, eyelet, hook, or other fastener or combination of fasteners or hardware for coupling with the server rack 22 and with the remainder of the linkage 200.

The tile anchor 215 may include appropriate structure for coupling with a tile 66 or other portion of a floor 27 intended for supporting a server rack 22 above the subfloor 29 and with the remainder of the linkage 200, such as with the rack anchor 210 and/or with the first linkage section 220. For example, the tile anchor 215 may include any suitable rivet, bolt, nut, clamp, eyelet, hook, or other fastener or combination of fasteners or hardware for coupling with the tile 66 or other portion of the floor 27 and with the remainder of the linkage 200.

The subfloor anchor 240 may include appropriate structure for coupling with a channel member 52 or other interface with the subfloor 29 and with the remainder of the linkage 200, such as with the second linkage section 230. For example, the subfloor anchor 240 may include any suitable rivet, bolt, nut, clamp, eyelet, hook, or other fastener or combination of fasteners or hardware for coupling with a channel member 52 or other interface with the subfloor 29 and with the remainder of the linkage 200.

The first linkage section 220 and the second linkage section 230 may be pivotable or otherwise movable relative to one another. Such capacity for relative movement may provide flexibility that may facilitate manipulating the linkage 200 for installation to anchor a server rack 22 relative to a subfloor 29.

The first linkage section 220 and the second linkage section 230 may be oriented opposite of the arrangement shown in FIG. 8, e.g., such that the first linkage section 220 is between the second linkage section 230 and the subfloor anchor 240 rather than the depicted arrangement in which the second linkage section 230 is between the first linkage section 220 and the subfloor anchor 240. For example, with reference to the arrangement in FIG. 4, the linkage 56 may be arranged so that the positions of the cable 122 and turnbuckle 140 are reversed so that the turnbuckle 140 is coupled to the lower eye-bolt 114 and the cable 122 is coupled to the upper eyebolt 156.

At least one of the first linkage section 220 or the second linkage section 230 may be length adjustable. For example, in the arrangement in FIG. 4, both the turnbuckle 140 and the cable 122 are length adjustable. The turnbuckle 140 may be length adjustable by rotating the frame 142. The cable 122 may be length adjustable, for example, by loosening the lower cable clamp 130, adjusting an amount of the lower end 124 of the cable 122 that extends beyond the lower cable clamp 130 away from the lower loop 126 (e.g., which may change a length of the cable 122 present between the lower cable clamp 130 and the upper cable clamp 138), and tightening the lower cable clamp 130 to secure the cable 122 at the new length. The upper cable clamp 138 may additionally or alternatively be manipulated in a similar fashion to provide additional or alternative length adjustment. In some embodiments, gross length adjustments of the linkage 56 may be accomplished by adjusting the length of the cable 122 and fine length adjustments may be accomplished by adjusting the turnbuckle 140. In various embodiments, mechanisms that provide length adjustment may be additionally or alternatively be utilized to facilitate tensioning of the linkage 200.

The linkage 200 in the first linkage section 220 and/or in the second linkage section 230 may include additional or alternative components for providing length adjustment and/or tensioning. Non-limiting examples may include flexible members such as cables (e.g., such as, but not limited to, the arrangement of cable 122 of FIG. 4) or chains (e.g., which may be length adjustable by altering a number of links included or by altering which in a series of links is used as a coupling interface to another component). Further non-limiting examples may include tensioning devices such as turnbuckles (e.g., turnbuckles such as, but not limited to, the turnbuckle 140 of FIG. 4, turnbuckles that include one shaft about which oppositely threaded-housings can turn, or other varieties of turnbuckles), spreader bars or other telescoping locking rods, come along tools or other pulley systems, chain binders or load binders, and/or other components capable of reducing slack and/or increasing tension within the linkage 200. In some embodiments, the first linkage section 220 and the second linkage section 230 may both be the same type of component. For example, the first linkage section 220 may correspond to a first turnbuckle and the second linkage section 230 may correspond to a second turnbuckle. Furthermore, the linkage 200 is not limited to two linkage sections, but may instead include additional linkage sections in some embodiments.

Figure 9:
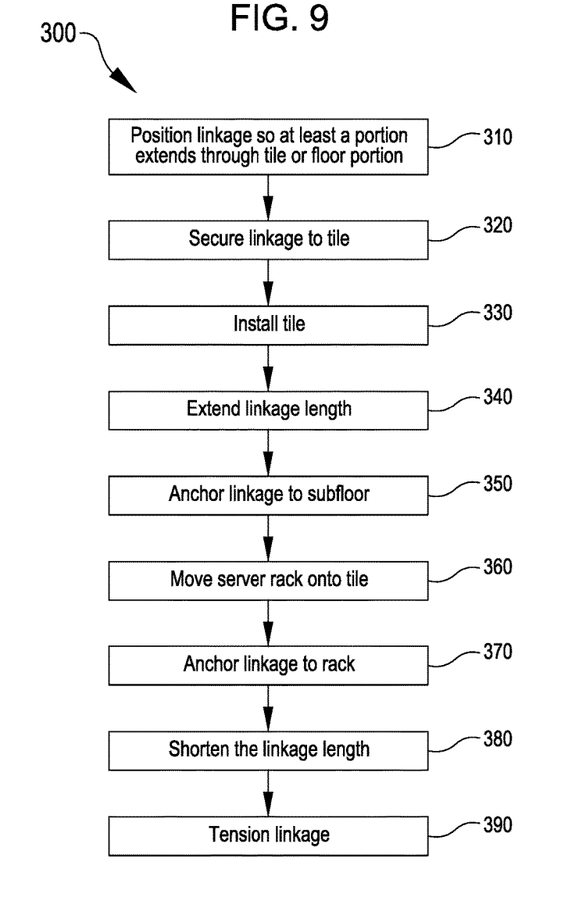
FIG. 9 is a flow chart illustrating a process that may be performed with respect to an anchoring system in accordance with various embodiments.

FIG. 9 is a flow chart illustrating a process 300 that may be performed for anchoring in accordance with various embodiments. At 310, the process 300 can include positioning a linkage 200 so that at least a portion of the linkage 200 extends through a tile 66 or other portion of the raised floor 27. For example, this may include positioning a linkage 200 so that that at least a portion of the linkage 200 (e.g., the upper eyebolt 156) extends through a tile 66 from below the tile 66 to above the tile 66. Extending at 310 may be performed within a data center (e.g., as shown in FIGS. 5-7) or remote from a data center (e.g., such as if a tile is pre-fabricated with a linkage preinstalled remote from the data center and then provided as a complete package for swapping out with an existing floor tile in a data center for facilitating ease of anchoring processes). In some embodiments, even if a technician at a datacenter utilizes a prefabricated tile with the linkage 200 preinstalled, the technician may still perform the operation 310 (e.g., installing the prefabricated tile 66 into a floor 27 may correspond to positioning the linkage 200 so that at least a portion of the linkage 200 extends through the tile 66 or other portion of the raised floor 27). Although extending at 310 is shown first in FIG. 9, the process 300 may be performed with the operations in a different order than shown and/or with fewer than all of the operations shown.

At 320, the process 300 can include securing the linkage to the tile 66 or other portion of the raised floor 27. For example, this may include securing a portion of the linkage 200 extending through the tile 66 (e.g., the upper eyebolt 156) in place using suitable hardware (e.g., the seating nut 164 and/or the seating washer 162). In some embodiments, securing to the tile at 320 may be omitted. For example, a technician in a datacenter might proceed without securing the linkage to the tile if the tile was received in a prepackaged assembly with the linkage already secured. As another example, a technician in a datacenter might proceed without securing the linkage 56 to the tile 66 in a scenario in which it was concluded that the coupling nut 166 or other hardware would suffice for coupling the server rack 22 to the remainder of the linkage 56 (e.g., in the absence of the seating nut 164).

At 330, the process 300 can include installing the tile 66. For example, this may include installing the tile 66 with the tile 66 having the linkage 200 at least partially coupled to the tile 66 so that at least portion of the linkage 200 extends through the tile 66. In some embodiments, installing the tile 66 at 330 may include installing the tile 66 having predrilled or otherwise prefabricated through holes 172 arranged for corresponding to the placement of anchoring features of a particular server rack 22. In some embodiments, the tile installing at 330 may be omitted, such as in a situation in which the tile 66 forms a part of a floor 27 that is already in place and which is simply manipulated (such as by drilling holes or removing anchoring components from existing holes) to facilitate anchoring processes for server racks 22.

At 340, the process 300 can include extending a linkage length. For example, this may correspond to rotating the turnbuckle 140 to move the upper arm 146 and lower arm 144 away from one another. Additionally or alternatively, this may correspond to extending an effective length of the cable 122. For example, the lower end 124 of the cable 122 may be fed or pushed through the lower cable clamp 130 to extend a length of the cable 122 present between the upper cable clamp 138 and the lower cable clamp 130 (and/or the upper and 132 of the cable 122 may similarly be manipulated relative to the upper cable clamp 138 for a similar outcome). Extending the linkage length at 340 may additionally or alternatively correspond to expanding a length of the first linkage section 220 and/or the second linkage section 230 by corresponding manipulation of any suitable length-adjustable option described for such components above. In some embodiments, extending the length of the linkage 200 at 340 may facilitate the linkage 200 reaching between a first anchoring point of the subfloor (e.g., the channel member 52) for the subfloor anchor and a second anchoring point of the server rack 22 (e.g., the hole 68 through the base 70 of the server rack 22) for the rack anchor. For example, this may be particularly useful in a situation in which the anchor points on the server rack and the subfloor are farther apart than normal or anticipated. In some embodiments, the operation of extending the linkage length at 340 may be moot, for example, if the linkage reaches between anchor points without adjustment.

At 350 in the process 300, the linkage 200 can be anchored to the subfloor. In some embodiments, this may correspond to the linkage 200 being anchored via a channel member 52 (e.g., as described above with respect to FIG. 5 or FIG. 8, although other subfloor anchoring components may additionally or alternatively be used.

At 360, the process 300 may include moving a server rack 22 at least partially onto the tile 66. For example, this may correspond to the server rack 22 being rolled via wheels across the floor 27 onto a tile 66 that had been cleared at least temporarily to facilitate installation of the linkage 200. In some embodiments, moving the server rack 22 at 360 may be facilitated by the coupling nut 166 being lowered to a position that will not collide with the base 70 of the server rack during such movement, such as described with respect to FIG. 6. In some embodiments, the operation at 360 of moving the server rack 22 onto the tile 66 may be moot, for example, if the server rack 22 is on a tile 66 and remains in position on that tile 66 while a technician simply works around the server rack 22 throughout the installation process of the linkage 200.

At 370, the process 300 may include anchoring the linkage 200 to a server rack 22. As examples, this may include anchoring the linkage 200 to a server rack 22 that has been on a tile 66 throughout the process 300 or to a server rack 22 that has been moved onto the tile 66 at some point during the process 300 (e.g., at 360). In some embodiments, this may correspond to the linkage 200 being anchored to the server rack 22 by the top bolt 170 (e.g., as described above with respect to FIG. 7), although other server rack anchoring components may additionally or alternatively be used. In some embodiments, anchoring the linkage 200 to the server rack 22 may include anchoring the server rack 22 to another portion of the linkage that is already anchored to the tile 66. As an example, anchoring the linkage 200 to the server rack 22 may include coupling the server rack 22 through the top bolt 170 and the coupling nut 166 to the upper eyebolt 156 that may be already secured to the tile 66 by the seating nut 164.

At 380, the process 300 may include shortening the linkage length. For example, this may correspond to rotating the turnbuckle 140 to move the upper arm 146 and lower arm 144 toward one another. Additionally or alternatively, this may correspond to reducing an effective length of the cable 122. For example, the lower end 124 of the cable 122 may be drawn or pulled through the lower cable clamp 130 to reduce a length of the cable 122 present between the upper cable clamp 138 and the lower cable clamp 130 (and/or the upper and 132 of the cable 122 may similarly be manipulated relative to the upper cable clamp 138 for a similar outcome). Reducing the linkage length at 340 may additionally or alternatively correspond to reducing a length of the first linkage section 220 and/or the second linkage section 230 by corresponding manipulation of any suitable length-adjustable option described for such components above. In some embodiments, reducing the length of the linkage 200 at 340 may eliminate excess slack in the linkage 200 between a first anchoring point of the subfloor (e.g., the channel member 52) for the subfloor anchor and a second anchoring point of the server rack 22 (e.g., the hole 68 through the base 70 of the server rack 22) for the rack anchor. For example, this may be particularly useful in a situation in which enough slack is present in the linkage that the stroke of the turnbuckle 140 or other tensioning mechanism is too short to remove the slack and place the linkage in tension. Shortening the linkage length at 380 may accordingly provide a coarse or large-scale adjustment that may facilitate a subsequent fine or small-scale adjustment by the turnbuckle 140 or other tensioning mechanism. In some embodiments, the operation of reducing the linkage length at 380 may be moot, for example, if slack in the linkage is mainly consumed in reaching between anchor points without adjustment.

At 390, the process may include tensioning the linkage. For example, this may correspond to rotating the turnbuckle 140 to reduce slack in the linkage (e.g., increase tension in the cable 122) and anchor the server rack 22 through the raised floor 27 of the datacenter 20 to the subfloor 29 beneath the raised floor 27, although other tensioning components may additionally or alternatively be used.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A method of securing a server rack in a datacenter through a raised floor of the datacenter to a subfloor of the datacenter beneath the raised floor, the method comprising:
    positioning a linkage so that at least a portion of the linkage extends from below the raised floor to above the raised floor, the linkage comprising a subfloor anchor, a rack anchor, a turnbuckle, and a cable coupled with the turnbuckle and arranged such that the cable and the turnbuckle are arranged between the subfloor anchor and the rack anchor;
    securing the subfloor anchor of the linkage to the subfloor;
    securing the rack anchor to the server rack;
    installing a coupling nut in a position receiving at least a portion of a first shaft and at least a portion of a second shaft, the first shaft extending through a portion of the server rack, the second shaft extending through the floor; and
    tensioning the linkage by at least rotating the turnbuckle to reduce slack in the linkage and anchor the server rack through the raised floor of the datacenter to the subfloor beneath the raised floor.

2. The method of claim 1, further comprising securing a portion of the linkage to the raised floor.

3. The method of claim 1, further comprising:
    installing a tile of the raised floor into the raised floor, the tile having the linkage at least partially coupled to the tile so that at least a portion of the linkage extends through the tile, the tile further being configured to support a load of the server rack when the tile is installed in the raised floor with the linkage extending at least partially through the tile; and
    moving the server rack at least partially onto the tile.

4. The method of claim 1, wherein securing the rack anchor to the server rack further comprises coupling the server rack to a portion of the linkage secured to a tile of the raised floor.

5. The method of claim 1, further comprising reducing a length of the linkage by adjusting the cable to reduce a distance that the cable extends between the rack anchor and the subfloor anchor.

6. The method of claim 1, further comprising increasing a length of the linkage by adjusting the cable to increase a distance that the cable extends between the rack anchor and the subfloor anchor to facilitate the linkage reaching between a first anchoring point of the subfloor for the subfloor anchor and a second anchoring point of the server rack for the rack anchor.

7. A datacenter comprising:
    a subfloor;
    a floor supported over the subfloor;
    a server rack supported on the floor; and
    a linkage extending at least in part through the floor and comprising at least:
        a subfloor anchor secured to the subfloor;
        a first shaft extending through the floor;
        a rack anchor secured to the server rack and comprising a second shaft extending through a portion of the server rack;
        a coupling nut receiving at least a portion of the first shaft and at least a portion of the second shaft;
        a cable; and
        a turnbuckle coupled with the cable, the turnbuckle and cable arranged in the linkage between the subfloor anchor and the rack anchor, the turnbuckle being in a tightened state such that the cable is in tension so as to anchor the server rack through the floor and via the linkage to the subfloor.

8. The datacenter of claim 7, further comprising a channel member fixed to the subfloor, wherein the subfloor anchor is secured via the channel member to the subfloor.

9. The datacenter of claim 7, wherein the linkage further comprises a cable clamp releasably securing a portion of the cable in a loop such that a length of the linkage between the subfloor anchor and the rack anchor is adjustable by adjusting a position of the cable relative to the cable clamp.

10. The datacenter of claim 7, wherein the linkage further comprises:
    an eyebolt comprising an eyelet and the first shaft, the first shaft further comprising a first threaded portion, the eyelet coupled via the turnbuckle and the cable to the subfloor anchor;
    a seating nut securing the eyebolt in a position extending at least partially through the floor so that the eyelet of the eyebolt is positioned below the floor and at least part of the first threaded portion of the eyebolt is positioned above the floor; and
    a bolt forming at least a part of the rack anchor and comprising the second shaft, the bolt having a second threaded portion and extending through a hole in a base of the server rack so that at least part of the second threaded portion of the bolt is positioned below the base of the server rack;

wherein the coupling nut is positioned receiving at least part of the first threaded portion and at least part of the second threaded portion so as to couple the server rack via the bolt, coupling nut, eyebolt, turnbuckle, and cable to the subfloor anchor.

11. The datacenter of claim 10, wherein the coupling nut is sized to be received on the first threaded portion of the eyebolt and above the seating nut into a position that permits the base of the server rack in the absence of the bolt to be moved over a top of the coupling nut in response to movement of the server rack along the floor.

12. The datacenter of claim 7, wherein the linkage comprises a first linkage coupled with a first side of the server rack, wherein the datacenter further comprises a second linkage coupled with a second side of the server rack different from the first side.

13. The datacenter of claim 12, further comprising a channel member fixed to the subfloor, wherein the first linkage and the second linkage are each secured via the channel member to the subfloor.

14. A system for anchoring a server rack through a floor of a datacenter to a subfloor beneath the floor, the system comprising:
  a subfloor anchor configured to be secured to the subfloor;
  a rack anchor configured to be secured to the server rack and comprising at least a first shaft configured to extend through a portion of the server rack;
  a second shaft configured to extend through the floor;
  a coupling nut configured for receiving at least a portion of the first shaft and at least a portion of the second shaft;
  a first linkage section comprising a tensioning device; and
  a second linkage section coupled with the first linkage section and comprising a flexible member configured to change orientation or have slack removed therefrom in response to operation of the tensioning device, wherein the first linkage section and the second linkage section are arranged between the subfloor anchor and the rack anchor.

15. The system of claim 14, wherein the tensioning device is configured to increase tension in the flexible member so as to anchor the server rack through the floor and via the system to the subfloor when the subfloor anchor is secured to the subfloor and when the rack anchor is secured to the server rack.

16. The system of claim 14, wherein the system further comprises a tile configured to form a part of the floor, wherein the system is configured to be at least partially coupled to the tile so that at least a portion of the system extends through the tile.

17. The system of claim 14, wherein the system further comprises the server rack.

18. The system of claim 14, wherein the system further comprises the datacenter, the floor of the datacenter, the subfloor, and the server rack.

19. The system of claim 14, further comprising a seating nut configured to seat the second shaft in a position extending through the floor.

* * * * *